United States Patent [19]

Sone et al.

[11] Patent Number: 4,617,487
[45] Date of Patent: Oct. 14, 1986

[54] PIEZOELECTRIC ELASTIC SURFACE WAVE ELEMENT WITH FILM OF TANTALUM PENTOXIDE OR SILICON NITRIDE

[75] Inventors: Takehiko Sone; Takehiro Takoshima; Yoshimi Kamijyo, all of Furukawa, Japan

[73] Assignee: Alps Electric Co., Ltd., Japan

[21] Appl. No.: 779,223

[22] Filed: Sep. 23, 1985

[30] Foreign Application Priority Data

Sep. 22, 1984 [JP] Japan ............................ 59-199019
Oct. 8, 1984 [JP] Japan ............................ 59-211148

[51] Int. Cl.⁴ .......................................... H01L 41/08
[52] U.S. Cl. ............................ 310/313 D; 310/313 B; 333/195
[58] Field of Search ........... 310/313 R, 313 A, 313 B, 310/313 C, 313 D; 333/150-155, 191, 195, 196

[56] References Cited

U.S. PATENT DOCUMENTS 3,991,330 11/1976 Isaacs et al. ..................... 310/313 B
4,028,648 6/1977 Hartmann et al. ........... 310/313 B X
4,081,769 3/1978 Shreve ........................ 310/313 B X Primary Examiner—Mark O. Budd
Attorney, Agent, or Firm—Guy W. Shoup

[57] ABSTRACT

An elastic surface wave element which has a grille-shaped electrode formed on a piezoelectric substrate is improved by having the grille-shaped electrode portion thereof covered with an insulating film made of tantalum pentoxide or silicon nitride. The insulating film functions to minimize the degradation of properties suffered by the conventional elastic surface wave element and preclude substantially completely the phenomenon of short-circuit between the electrode bars of the grille-shaped electrode.

2 Claims, 9 Drawing Figures

4,617,487

PIEZOELECTRIC ELASTIC SURFACE WAVE ELEMENT WITH FILM OF TANTALUM PENTOXIDE OR SILICON NITRIDE

BACKGROUND OF THE INVENTION

1. Field of the Invention

This invention relates to an elastic surface wave element useful as a delay line, an oscillator, a filter, etc.

2. Description of the Prior Art

The elastic surface wave element has heretofore been utilized in special military applications. In recent years, it has come to be used in such civilian devices as FM tuner and TV and has been arresting rapidly growing attention. Specifically, elastic surface wave elements have been reduced to such commercial products as delay elements, oscillators, and filters. The elastic surface wave elements of various types are characterized by compactness, light weight, and high reliability and by the fact that the process for their production is similar to that for the production of integrated circuits and, therefore, abounds in mass producibility. At present, they are being mass produced as indispensable electronic parts.

A typical conventional elastic surface wave element will be described below as embodied in an elastic surface wave rexonator. As illustrated in FIG. 7 and FIG. 8, an electrode 2 formed of an electroconductive substance after the pattern of a grille is deposited on a piezoelectric substrate 1. In this case, the piezoelectric substrate 1 is formed of a piezoelectric single crystal or piezoelectric ceramic such as of quartz or lithium niobate or a piezoelectric film superposed on the surface of glass. The grille-shaped electrode 2 can be formed by vacuum depositing a metal such as aluminum or gold on the surface of the piezoelectric substrate 1 and photoetching the deposited layer of metal in a prescribed pattern. A pair of latticed reflectors 3, 3 each composed of a dielectric, a conductor, grooves, etc. are formed on each on both sides of the grille-shaped electrode 2.

When a voltage of a specific frequency is applied on the grille-shaped electrode 2, an electric field is generated on the surface of the piezoelectric substrate 1 in the spaces of the grille-shaped electrode 2 and, owing to the piezoelectricity of the piezoelectric substrate 1, strain is produced proportionately to the magnitude of the applied voltage. This strain is propagated as surface wave in both directions at a speed of sound fixed by the kind of material of the piezoelectric substrate 1. The surface wave is reflected by the latticed reflectors 3, 3 disposed on both sides and returned to the grille-shaped electrode 2 to induce resonance.

Generally, any elastic surface wave element of this class is tightly enclosed in a metallic container called a hermetic seal 4 and constructed as illustrated in FIG. 9. In due consideration of the sealing property and the resistance to corrosion, the hermetic seal 4 is plated with a nickel coating, for example.

The conventional elastic surface wave element of the foregoing construction, however, suffers from the disadvantage that electroconductive foreign matter which has found its way to the elastic surface wave element before the element is tightly enclosed in the hermetic seal 4 or part of the nickel plating peeling off the surface of the hermetic seal adheres to the grille-shaped electrode and induce the phenomenon of short-circuit between the electrode bars. The short-circuit brings about various hindrances such as variation in electric impedance. This disadvantage impairs the reliability of the elastic surface wave element and interferes with mass production of such surface wave elements.

SUMMARY OF THE INVENTION

An object of this invention is to provide an elastic surface wave element so constructed as to avoid inducing the phenomenon of short-circuit between electrode bars owing to the deposition of chippings of the coating on the hermetic seal or some other similar electroconductive foreign matter.

The other objects and characteristic features of this invention will become apparent from the description given in further detail hereinbelow with reference to the accompanying drawings. Pentoxide is superposed

DETAILED DESCRIPTION OF THE INVENTION

In the first aspect of this invention, an insulating film made of tantalum on the grille-shaped electrode portion.

In the second aspect of this invention, an insulating film made of silicon nitride is superposed on the grille-shaped electrode portion.

In the elastic surface wave element, the surface wave is propagated on the piezoelectric substrate. It is generally held, therefore, that when the insulating film is sperposed on the piezoelectric substrate, it interferes with the propagation of the surface wave and degrades the properties of the eleastic surface wave element. It has been found, however, that when the insulating film is superposed exclusively on the grille-shaped electrode portion of the elastic surface wave element, this degradation of the properties of the elastic surface wave element can be repressed to a negligible extent or to an extent manageable from the standpoint of design. The coating of the grille-shaped electrode portion of the elastic surface wave element warrants virtually perfect prevention of the phenomenon of short-circuit between the electrode bars of the grille-shaped electrode, enhances the reliability of the elastic surface wave element and, at the same time, contributes a great deal to the materialization of mass production.

In the first aspect of this invention, the insulating film to cover the grille-shaped electrode portion is made of tantalum pentoxide. Various substances have been tried as materials for the insulating film. It has been consequently found that when the insulating film is made of tantalum pentoxide, the degradation of properties of the elastic surface wave element can be decreased to an extremely small level and, moreover, the phenomenon of short-circuit between the electrode bars of the grille-shaped electrode can be effectively prevented. The film of tantalum pentoxide can be formed by spattering vacuum deposition, for example.

In the second aspect of this invention, the insulating film to cover the grille-shaped electrode portion is made of silicon nitride. It has been found that when the insulating film is made of silicon nitride, the degradation of properties of the elastic surface wave element can be decreased to an extremely low level and the phenomenon of short-circuit between the electrode bars of the grille-shaped electrode can be effectively prevented similarly to the insulating film of tantalum pentoxide described above. The insulating film of silicon nitride can be formed by plasma CVD, for example.

Figure 1:
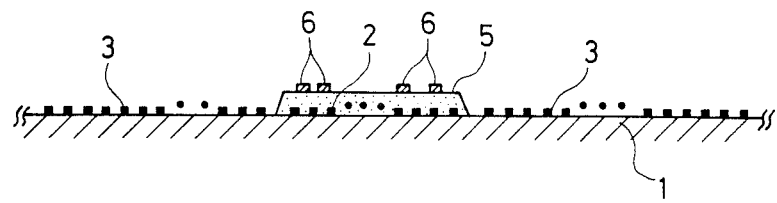
FIG. 1 is a cross section illustrating a typical elastic surface wave resonator as the embodiment of this invention.
Figure 2:
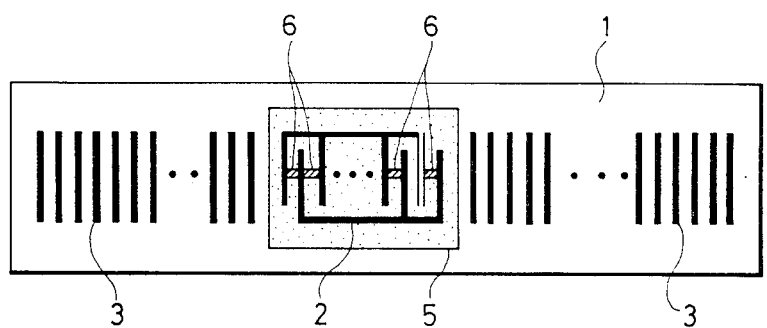
FIG. 2 is a plan view of the elastic surface wave resonator of FIG. 1.

In the first embodiment of this invention, as illsutrated in FIG. 1 and FIG. 2, aluminum was vacuum deposited by the spattering method in a thickness of 1 μm on a quartz substrate 1 which had undergone specular grinding in advance. Then, by etching the deposited layer of aluminum by the conventional wet etching method, a grille-shaped electrode 2 and reflectors 3 were formed. Then, tantalum pentoxide was vacuum deposited thereon by spattering at a substrate heating temperature of 200° C., at a film-forming rate of 0.9 μm/hr, under a combined pressure $2 \times 10^{-3}$ Torr of a mixed gas of Ar+$O_2$ with the substrate kept rotated about its own center. The portion of the layer of tuntalum pentoxide falling outside the grille-shaped electrode 2 was removed to give rise to an insulating film 5 of tantalum pentoxide. Thus was completed an elastic surface wave resonance.

Now, to test for the effect in preventing the phenomenon of short-circuit between the electrode bars of the grille-shaped electrode 2, aluminum was vacuum deposited by the spattering method in a thickness of 2000 Å on the grille-shaped electrode 2 portion to form simulated electroconductive foreign matters 6. These simulated electroconductive foreign matters 6 ere so large as to lie astride the grille-shaped electrode 2. Several such simulated electroconductive foreign matters were applied fast at desired positions on the insulating film 5 of tantalum pentoxide covering the grille-shaped electrode 2. These simulated electroconductive foreign matters 6 were used in the study on the phenomenon of short-circuit between the electrode bars of the grille-shaped electrode 2. This testing method was experimentally demonstrated to enable the test to be performed more precisely and exactly with a smaller sample size than the conventional vibration test.

Then, elastic surface wave resonators of the foregoing construction were produced with the thickness of the insulating film of tantalum pentoxide varied in three sizes, 1,000 Å, 2,000 Å, and 3,000 Å. They were tested for fraction of defective DC resistance between the electrode bars of the grille-shaped electrode and for ratio of increase in resonance resistance. The eleastic surface wave resonances used for the test were invariably of a 90 MHz zone. The results are shown in FIG. 3.

Figure 3:
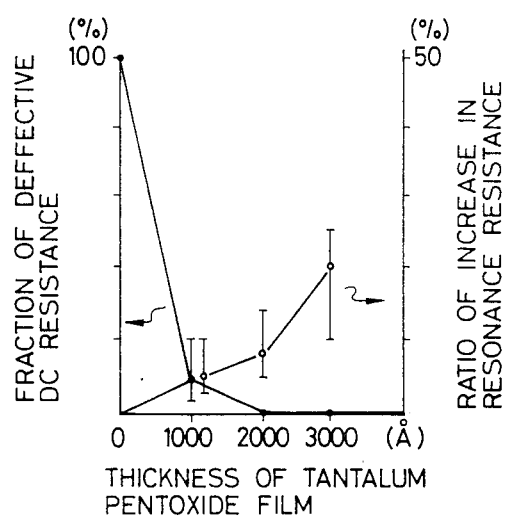
FIG. 3 is a graph showing the results of test performed on the elastic surface wave resonator of FIG. 1.

It is noted from FIG. 3 that when the thickness of the insulating film 5 of tantalum pentoxide is 1,000 Å, the fraction of defective DC resistance owing to the simulated electroconductive foreign matter 6 of aluminum averages about 5% and that when the thickness of the insulating film 5 is increased to 2,000 Å, the fraction of defective DC resistance is zeroed. This fact indicates that the increase in the thickness of the insulating film 5 is effective in lowering the fraction of defective DC resistance. It is further noted that when the thickness of the insulating film 5 is 2,000 Å, the ratio of increase in resonance resistance is negligible or manageable from the standpoint of design and offers no practicable problem. By the analysis with a scanning type electron microscope and an X-ray microanalyzer, it has been confirmed that, while various electroconductive foreign particles are responsible for the phenomenon of short-circuit between the electrode bars, chippings of the metal plate on the hermetic seal are particularly responsible for the trouble.

Figure 4:
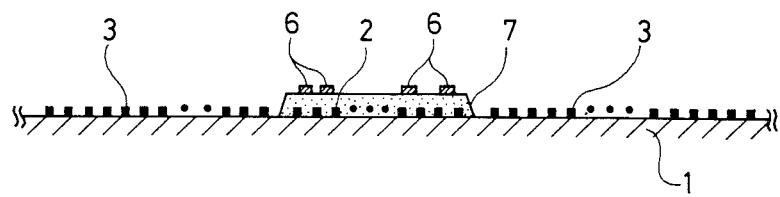
FIG. 4 is a cross section illustrating another typical elastic surface wave resonator as the second embodiment of this invention.
Figure 5:
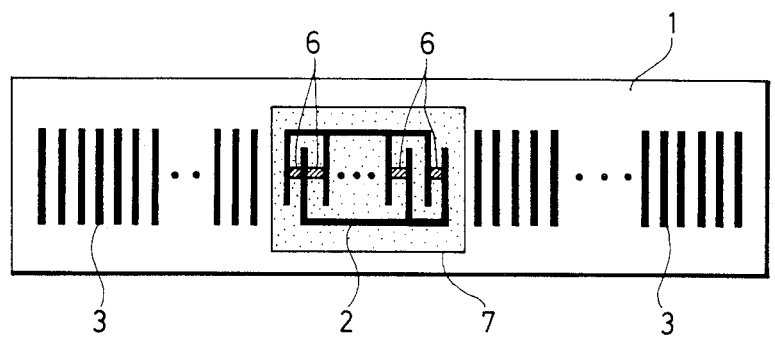
FIG. 5 is a plan view of the elastic surface wave resonator of FIG. 4.

In the second embodiment of this invention, as illustrated in FIG. 4 and FIG. 5, aluminum was vacuum deposited by the spattering method in a thickness of 1 μm on a quartz substrate 1 which had undergone specular grinding in advance. Then, by etching the deposited layer of aluminum by the conventional wet etching method, a grille-shaped electrode 2 and reflectors 3 were formed. Then, silicon nitride was vacuum deposited thereon by the plasma CVD method at a substrate heating temperature of 250° C., at a film-forming rate of 400 Å/min, under a combined pressure 2 Torrs of a mixed gas of silane and nitrogen, under application of 200-W of power. The portion of the layer of silicon nitride falling outside the grille-shaped electrode 2 was removed to give rise to an insulating film 7 of silicon nitride. Thus was completed an elastic surface wave resonance.

Now, to test for the effect in preventing the phenomenon of short-circuit between the electrode bars of the grille-shaped electrode 2, aluminum was vacuum deposited by the spattering method in a thickness of 2000 Å on the grille-shaped electrode 2 portion to form simulated electroconductive foreign matters 6. These simulated electroconductive foreign matters 6 were so large as to lie astride the grille-shaped electrode 2. Several such simulated electroconductive foreign matters were applied fast at desired positions on the insulating film 7 of silicon nitride covering the grille-shaped electrode 2. These simulated electroconductive foreign matters 6 were used in the study on the phenomenon of short-circuit between the electrode bars of the grille-shaped electrode 2. This testing method was experimentally demonstrated to enable the test to be performed more precisely and exactly with a smaller sample size than the conventional vibration test.

Then, elastic surface wave resonators of the foregoing construction were produced with the thickness of the insulating film 7 of silicon nitride varied in three sizes, 1,000 Å, 2,000 Å, and 3,000 Å. They were tested for fraction of defective DC resistance between the electrode bars of the grille-shaped electrode and for ratio of increase in resonance resistance. The elastic surface wave resonances used for the test were invariably of a 90 MHz zone. The results are shown in FIG. 6.

Figure 6:
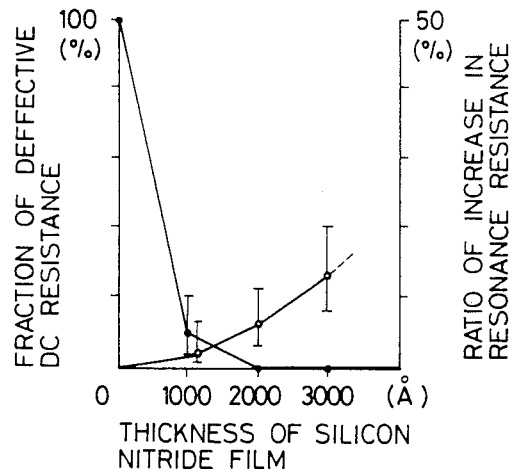
FIG. 6 is a graph showing the results of test performed on the elastic surface wave resonator of FIG. 4.
Figure 7:
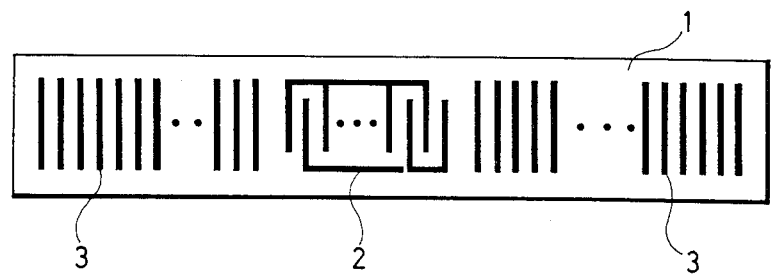
FIG. 7 is a plan view illustrating a typical conventional elastic surface wave resonator.
Figure 8:
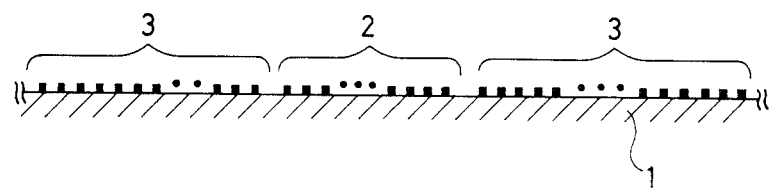
FIG. 8 is a cross section of the elastic surface wave resonator of FIG. 7.
Figure 9:
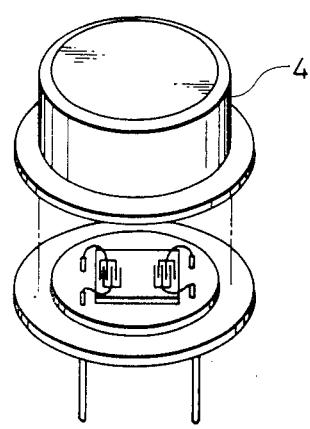
FIG. 9 is a perspective view illustrating the shape of a product having an elastic surface wave element tightly enclosed with a hermetic seal.

It is noted from FIG. 6 that when the thickness of the insulating film 7 of silicon nitride is 1,000 Å, the fraction of defective DC resistance owing to the simulated electroconductive foreign matter 6 of aluminum averages about 5% and that when the thickness of the insulating film 7 is increased to 2,000 Å, the fraction of defective DC resistance is zeroed. It is further noted that when the thickness of the insulating film 7 is 2,000 Å, the ratio of increase in resonance resistance is negligible or manageable from the standpoint of design and offers no practicable problem. By the analysis with a scanning type electron microscope and an X-ray microanalyzer, it has been confirmed that, while various electroconductive foreign particles are responsible for the phenomenon of short-circuit between the electrode bars, chippings of the metal plate on the hermetic seal are particularly responsible for the trouble.

As described above, this invention covers the grille-shaped electrode portion on the piezzoelectric substrate with an insulating film made of tantalum pentoxide or silicon nitride. Owing to the insulating film, this invention prevents the elastic surface wave element from otherwise possible degradation of properties and warrants substantially complete prevention of the phenomenon of short-circuit between the electrode bars of the grille-shaped electrode and enhances the reliability of the elastic surface wave element. It further represses the occurrence of defectives in the mass production and facilitates various attendant works such as inspection of products.

What is claimed is:

1. An elastic surface wave element having a grille-shaped electrode formed on a piezzoelectric substrate, which is characterized by covering said grille-shaped electrode portion with an insulating film of tantalum pentoxide.

2. An elastic surface wave element having a grille-shaped electrode formed on a piezzoelectric substrate, which is characterized by covering said grille-shaped electrode portion with an insulating film of silicon nitride.

* * * * *